(12) United States Patent
Barasinski

(10) Patent No.: US 8,044,728 B2
(45) Date of Patent: Oct. 25, 2011

(54) CIRCUIT AND METHOD FOR MEASURING THE PERFORMANCE PARAMETERS OF TRANSISTORS

(75) Inventor: Sébastien Barasinski, Meylan (FR)

(73) Assignee: STMicroelectronics SA, Montrouge (FR)

( * ) Notice: Subject to any disclaimer, the term of this patent is extended or adjusted under 35 U.S.C. 154(b) by 118 days.

(21) Appl. No.: 12/543,162

(22) Filed: Aug. 18, 2009

(65) Prior Publication Data
US 2010/0045390 A1    Feb. 25, 2010

(30) Foreign Application Priority Data
Aug. 19, 2008    (FR) ...................... 08 55622

(51) Int. Cl.
*H03K 3/03*    (2006.01)
*G01R 31/02*    (2006.01)

(52) U.S. Cl. ... 331/57; 331/44; 324/762.09; 324/762.01

(58) Field of Classification Search ..................... 331/57, 331/44; 324/762.09, 762.01, 750.3; 365/201, 365/203
See application file for complete search history.

(56) References Cited

U.S. PATENT DOCUMENTS

| | | | |
|---|---|---|---|
| 5,867,033 A | 2/1999 | Sporck et al. | 324/763 |
| 6,191,630 B1 | 2/2001 | Ozawa et al. | 327/278 |
| 7,265,639 B2 * | 9/2007 | Bhushan et al. | 331/57 |
| 2003/0122627 A1 | 7/2003 | Takahashi | 331/57 |
| 2005/0012556 A1 | 1/2005 | Bhushan et al. | 331/57 |

FOREIGN PATENT DOCUMENTS

| | | |
|---|---|---|
| FR | 2758022 | 7/1998 |
| FR | 2775832 | 9/1999 |

* cited by examiner

*Primary Examiner* — Ryan Johnson
(74) *Attorney, Agent, or Firm* — Lisa K. Jorgenson; Allen, Dyer, Doppelt, Milbrath & Gilchrist, P.A.

(57) ABSTRACT

An integrated circuit may include an inverter which may include a first transistor of a first conductivity type and a second transistor of a second conductivity type connected in parallel with the first transistor. An input of the inverter may be capable of receiving an oscillating input signal, and which may include an output of the inverter, which is connected to a capacitive device capable of being charged and discharged depending on the state of the first and second transistors being on or off. The inverter may be capable of delivering an oscillating output signal at its output. The integrated circuit may include a selector for transmitting the oscillating output signal and for masking the charging and/or discharging of the capacitive device.

10 Claims, 8 Drawing Sheets

CIRCUIT AND METHOD FOR MEASURING THE PERFORMANCE PARAMETERS OF TRANSISTORS

FIELD OF THE INVENTION

The invention relates to a circuit and a method for measuring the performance parameters of transistors. In particular, the invention relates to the measurement of the speed and power consumption performance parameters of such transistors.

BACKGROUND OF THE INVENTION

Today, integrated electronic circuits include many transistors, and it may be useful to know the performance parameters of the transistors to maintain an operational quality for the integrated circuits. Indeed, measuring the performance parameters of the transistors allows them to be sorted by performance ranges, or provides the ability to subsequently correct performance losses to optimize the operation of the integrated circuits.

It therefore may be useful to know the speed performance parameters of transistors, or in other words, the capacity of a transistor to conduct current when it is in the on state. In particular, as the majority of integrated circuits are fabricated with Complementary Metal Oxide Semiconductor (CMOS) transistors, it may be desirable to differentiate the performance parameters of the transistors of the p-MOS type (p-doped channel transistors) from those of the transistors of the n-MOS type (n-doped channel transistors). This is because the various types of CMOS transistors can exhibit different performance parameters within the same integrated circuit.

One type of circuit is the ring oscillator that includes inverters with two n-MOS and p-MOS transistors, and which may be well known to those skilled in the art, but these circuits do not allow the performance parameters of each type of transistor to be decorrelated.

In addition, the power consumption of a transistor is a strategic factor for users of integrated circuits inside systems operating with small energy storage units, such as mobile telephones, PDAs, etc. The power consumption of a transistor is mainly due to the leakage current flowing inside a transistor when it is powered and when it is in the steady state, or in other words, when it is held in the off or on state. It is therefore important to determine the power consumption of a transistor and, more particularly, in static operation when the latter is powered without being loaded to determine the power consumption of a system including several transistors.

In the following, a transistor is considered to be in the on state when it allows an electrical current to flow between its source and its drain, and to be in an off state when it does not allow an electrical current to flow between its source and its drain.

Currently, the power consumption of circuits is typically quantified by analysis of the discharge time through a large transistor. However, this technique may not adapt to the conditions of limited surface area. This is because typically the smaller the transistor, the longer the discharge time, and hence the longer the analysis of the power consumption of the transistors. Since the size of transistors continues to become smaller, the analysis of their power consumption shall be fast, of very limited size, and sufficiently precise. In addition, the current technique includes waiting for the complete discharge of a transistor, which can lead to a measurement that takes long to implement.

Furthermore, transistors may be the main elements of memory systems, such as Static Random Access Memory (SRAM), commonly referred to as volatile memory. The transistors equipping these SRAM systems are typically configured in a specific manner. In other words, each transistor may be placed within a particular environment.

To measure the performance parameters of a transistor that is included within an SRAM system, it may be placed within its specific environment. In other words, the elements that characterize an SRAM system may be recreated, and the transistor's performance parameters measured within this recreated SRAM system.

SUMMARY OF THE INVENTION

In view of the above, the present description relates to a method and an integrated circuit allowing the performance parameters of the transistors to be quantified in terms of speed and power consumption. A method and an integrated circuit are also provided that enable these performance parameters to be quantified when the transistors are placed in an environment of the SRAM type.

According to one aspect, an integrated circuit is therefore provided that includes an inverter which may include a first transistor of a first conductivity type and a second transistor of a second conductivity type connected in parallel with the first transistor. An input of the inverter may be capable of receiving an oscillating input signal.

According to a general feature of this circuit, an output of the inverter may be coupled to a capacitive device capable of being charged and discharged depending on the state of the first and second transistors being on or off. The inverter may be capable of delivering an oscillating output signal at its output. The integrated circuit may include a selector for transmitting the oscillating output signal and for masking the charging and/or discharging of the capacitive device.

Thus, the selector allows at least one oscillating output signal to be delivered, which highlights the performance of a transistor of a first conductivity type since it masks the effects of a transistor of a second conductivity type on the output signal. The output signal thus generated therefore allows the performance parameters of one type of transistor to be analyzed by decorrelating the effects of each type of transistor on an oscillating output signal. Such an integrated circuit enables the speed performance parameters of the transistors to be measured.

According to one embodiment, the first and second transistors of the first inverter have their gate connected to the input of the first inverter, and their drain connected to the output of the first inverter. The first transistor of the first conductivity type has its source connected to ground, and the second transistor of the second conductivity type has its source connected to a supply voltage. With this configuration, the capacitive device is discharged by the first transistor of the first conductivity type, and the capacitive device is charged up by the second transistor of the second conductivity type.

According to another feature of the circuit, the selector includes a second inverter including a third transistor of the first conductivity type, and a fourth transistor of the second conductivity type connected in parallel with the third transistor. The third and fourth transistors of the second inverter have their gate connected to the input of the first inverter, and their drain connected to an output of the second inverter. The fourth transistor of the second conductivity type has its source connected to the supply voltage, and the third transistor of the first conductivity type has its source connected to the output of the first inverter.

Such an embodiment allows, on one hand, the output signal of the first inverter to be transmitted by a transistor of the second inverter of a first conductivity type and, on the other hand, charging or discharging of the capacitive device with a transistor of the second inverter of a second conductivity type to be masked.

Advantageously, the transistor of the first inverter, which allows the capacitive device to be discharged, could be the same type as the transistor of the second inverter, which allows the output signal to be transmitted. Indeed, in this configuration, the effects of a transistor of the first conductivity type on the discharge of a capacitive device could be revealed by masking the effect of the charging of the capacitive device which is produced by the transistor of the second conductivity type.

According to a further feature, the first inverter includes a fifth transistor of the first conductivity type configured such that its gate is connected to the input of the first inverter, its source being connected to the output of the first inverter, and its drain being connected to the drain of the first transistor of the first conductivity type of the first inverter. By virtue of such a configuration, the environment of an SRAM system can be recreated, and the performance parameters of the transistors of the first conductivity type thus measured within the SRAM system.

According to yet another feature, the selector includes a third inverter including a sixth transistor of the first conductivity type and a seventh transistor of the second conductivity type connected in parallel with the sixth transistor. The sixth and seventh transistors of the third inverter have their gate connected to the input of the first inverter, and their drain connected to an output of the third inverter. The seventh transistor of the second conductivity type has its source connected to the output of the first inverter, and the sixth transistor of the first conductivity type has its source connected to ground. Such an embodiment allows, on the one hand, the output signal of the first inverter to be transmitted by a transistor of the second inverter of a second conductivity type and, on the other hand, charging or discharging of the capacitive device with a transistor of the second inverter of a first conductivity type to be masked.

Advantageously, the transistor of the first inverter, which allows the capacitive device to be charged, could be of the same type as the transistor of the second inverter, which allows the output signal to be transmitted. Indeed, in this configuration, the effects of a transistor of the second conductivity type on the charging of a capacitive device could be revealed by masking the effect of the discharging of the capacitive device, which is produced by the transistor of the first conductivity type.

It should be noted that the selector can supply two output signals by the second and third inverters to mask, respectively, the effects of a transistor of a first conductivity type and the effects of a transistor of a second conductivity type.

According to one exemplary embodiment, a ring oscillator circuit includes an odd number of integrated circuits according to any one of the preceding embodiments, in which the integrated circuits are mounted in series such that the input of the first inverter of one of the integrated circuits is connected to an output of the selector of a neighboring integrated circuit in the series. By virtue of such a circuit, an oscillating signal can be delivered whose frequency directly reflects the effect of a transistor of the first or second conductivity type. In addition, a frequency analysis of the signal is readily carried out.

According to another feature, a circuit for measuring the performance parameters of at least one transistor of a circuit such as defined hereinabove includes an additional integrated circuit, which includes an eighth transistor of the second conductivity type having its gate capable of receiving a pre-charge signal reset to a high voltage. Its source is connected to a supply voltage, and its drain is connected to a pre-charge signal reset to a low voltage. A ninth transistor of the first conductivity type has its gate connected to the drain of the eighth transistor of the second conductivity type, its source being connected to ground, and its drain being connected to the gate of the eighth transistor of the second conductivity type.

By virtue of such a circuit, the performance parameters of a sample of CMOS transistors can be measured to determine the technical characteristics of speed and power consumption of the transistors originating from the same production mode. More particularly, the additional integrated circuit provides a measurement that is simple and of limited size since it includes two transistors, and may easily be embedded in an electronic integrated circuit. Moreover, by configuring the two transistors such that the discharge of one controls the other transistor, and vice versa, the discharge phase is accelerated, and so is the measurement phase, which provides for quantifying the power consumption of a transistor quickly.

Advantageously, the additional integrated circuit includes two transistors of different conductivity types to establish a mean representation of the contribution of each of the transistors of the two types of conductivity. By virtue of such a measurement circuit, the performance parameters, namely the speed and power consumption, of the transistors of the two conductivity types can be measured. In addition, the additional integrated circuit may be used on its own in order to just measure the power consumption performance parameters of the transistors. According to another feature, the additional integrated circuit inverts the pre-charge signals reset to a high voltage and to a low voltage, which provides a signal inverter.

According to yet another feature, the measurement circuit also includes an additional integrated circuit, which includes a tenth transistor of the second conductivity type having its gate connected to the pre-charge signal reset to a low voltage, and its drain being connected to the pre-charge signal reset to a high voltage. An eleventh transistor of the first conductivity type has its gate connected to the pre-charge signal reset to a high voltage, and its drain connected to the pre-charge signal reset to a low voltage. A twelfth transistor of the first conductivity type has its gate connected to ground, its drain connected to the drain of the tenth transistor of the second conductivity type, and its source connected to a first input voltage. A thirteenth transistor of the first conductivity type has its gate connected to ground, its drain connected to the drain of the eleventh transistor of the first conductivity type, and its source connected to a second input voltage.

According to yet another feature, the circuit for measuring the performance parameters of at least one transistor includes a plurality of additional integrated circuits which are connected in parallel in such a manner that the pre-charge signals reset to a high voltage of each additional integrated circuit are connected to a first common pre-charge signal reset to a high voltage. The supply voltages for each additional integrated circuit are connected to a common supply voltage. The pre-charge signals reset to a low voltage of each additional integrated circuit are connected to a second common pre-charge signal reset to a low voltage. The measurement circuit includes a pre-charger for detecting an inversion of at least one common pre-charge signal, and for resetting the common pre-charge signals at each inversion of at least one common pre-charge signal.

According to another aspect, a telephony system includes an integrated circuit according to any one of the preceding embodiments is provided. Furthermore, this integrated circuit can be embedded in other electronic applications, and is not limited to telephony.

According to yet another aspect, a method for measuring the performance parameters of at least one transistor of an inverter having a first transistor of a first conductivity type and a second transistor of a second conductivity type is provided. An input of the inverter is capable of receiving an oscillating input signal.

According to a general feature of this method, a capacitive device is charged and discharged depending on the state of the transistors being on or off. An oscillating output signal is delivered and the charging and/or the discharging of the capacitive device is/are masked.

According to one embodiment, an additional third transistor of the first conductivity type and fourth transistor of the second conductivity type are pre-charged to opposite initial voltages to turn off the additional third and fourth transistors. The pre-charge step is reset when at least one of the voltages is inverted with respect to its initial value. Other advantages and features of the invention will become apparent upon examining the detailed description of non-limiting embodiments and their implementations, and of the appended drawings.

DETAILED DESCRIPTION OF THE PREFERRED EMBODIMENTS

Figure 1:
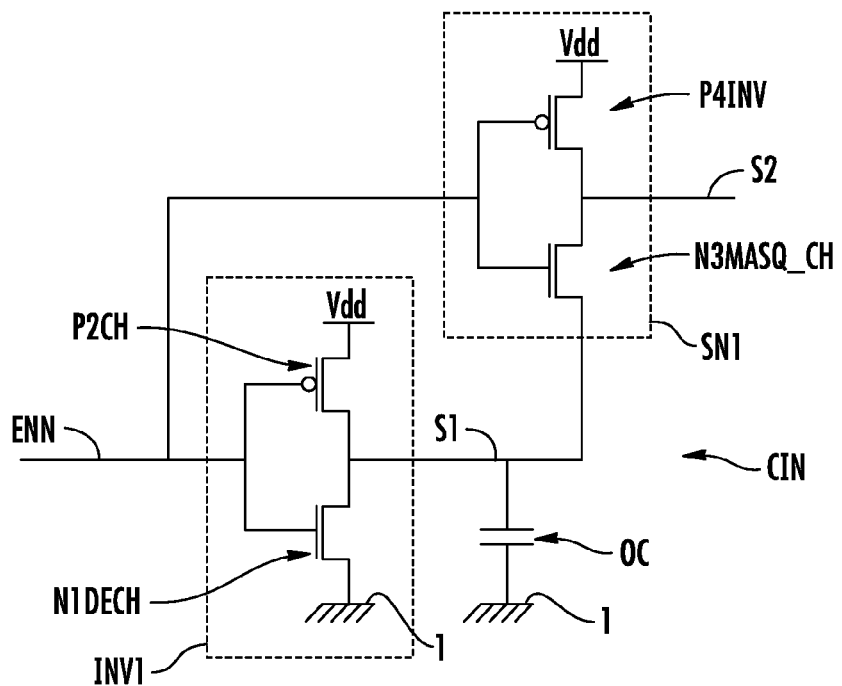
FIG. 1 schematically illustrates a first embodiment of an integrated circuit equipped with a selector in accordance with the present invention.

Referring to FIG. 1, an integrated circuit CIN is shown including a selector SN1. The integrated circuit CIN includes a first transistor N1DECH and a third transistor N3MASQ_CH of a first conductivity type, n-MOS. The integrated circuit CIN also includes a second transistor P2CH and a fourth transistor P4INV of a second conductivity type, p-MOS.

The integrated circuit CIN also includes a first inverter INV1 which includes the first transistor N1DECH and the second transistor P2CH connected in parallel with the first transistor N1DECH. The first and second transistors N1DECH, P2CH have their gates connected to an input ENN of the first inverter, and their drain connected to an output S1 of the first inverter. The first transistor N1DECH has its source connected to ground 1, and the second transistor P2CH, has its source connected to a supply voltage Vdd. The output S1 of the first inverter is connected to a capacitive device OC. The capacitive device OC is connected to ground 1.

The selector SN1 is an inverter including the third transistor N3MASQ_CH and the fourth transistor P4INV connected in parallel with the third transistor N3MASQ_CH. The third and fourth transistors of the second inverter SN1 have their gates connected to the input ENN of the first inverter INV1, and their drain connected to an output S2 of the second inverter SN1. The fourth transistor P4INV has its source connected to the supply voltage Vdd, and the third transistor N3MASQ_CH has its source connected to the output S1 of the first inverter.

The input ENN of the first inverter is capable of receiving an oscillating signal, which is a control signal for the transistors of the integrated circuit CIN. The signal oscillates between 0 volts and the supply voltage Vdd. When the input signal ENN is equal to 0 volts, the first and third n-MOS transistors N1DECH, N3MASQ_CH are turned off and the second and fourth transistors P2CH, P4INV are on. In this case, the second transistor P2CH of the first inverter INV1 is on, which has the effect of charging the capacitive device OC, in other words, gradually increasing the potential of the capacitive device OC from a zero value up to the supply voltage Vdd. Simultaneously, as the capacitive device OC charges, the third transistor N3MASQ_CH of the second inverter SN1 is turned off, which has the effect of masking the charging of the capacitive device OC, in other words, preventing the increase in the potential of the capacitive device OC from being seen on the signal produced at the output S2. Furthermore, the fourth transistor P4INV of the second inverter SN1 is on, which has the effect of inverting the input signal ENN, in other words, rapidly bringing the signal produced at the output S2 to the supply voltage Vdd.

In the opposite case, when the input signal ENN is equal to the supply voltage Vdd, the first and third n-MOS transistors N1DECH, N3MASQ_CH are on and the second and fourth transistors P2CH, P4INV are in the off state. In this case, the first transistor N1DECH of the first inverter INV1 is on, which has the effect of discharging the capacitive device OC, in other words gradually decreasing the potential of the capacitive device OC from the supply voltage Vdd down to 0 volts. Simultaneously, as the capacitive device OC discharges, the third transistor N3MASQ_CH of the second inverter SN1 is turned on, which has the effect of transmitting the discharge of the capacitive device OC, in other words, allowing the decrease in potential of the capacitive device OC to be seen on the signal produced at the output S2.

It will be noted that for the capacitive device OC to be completely charged to the supply voltage Vdd, the source of the second transistor P2CH is connected to the supply voltage Vdd. In the same way as for ensuring the complete discharge of the capacitive device OC to the zero voltage of ground 1, the source of the first transistor N1DECH is connected to ground 1.

Figure 2:
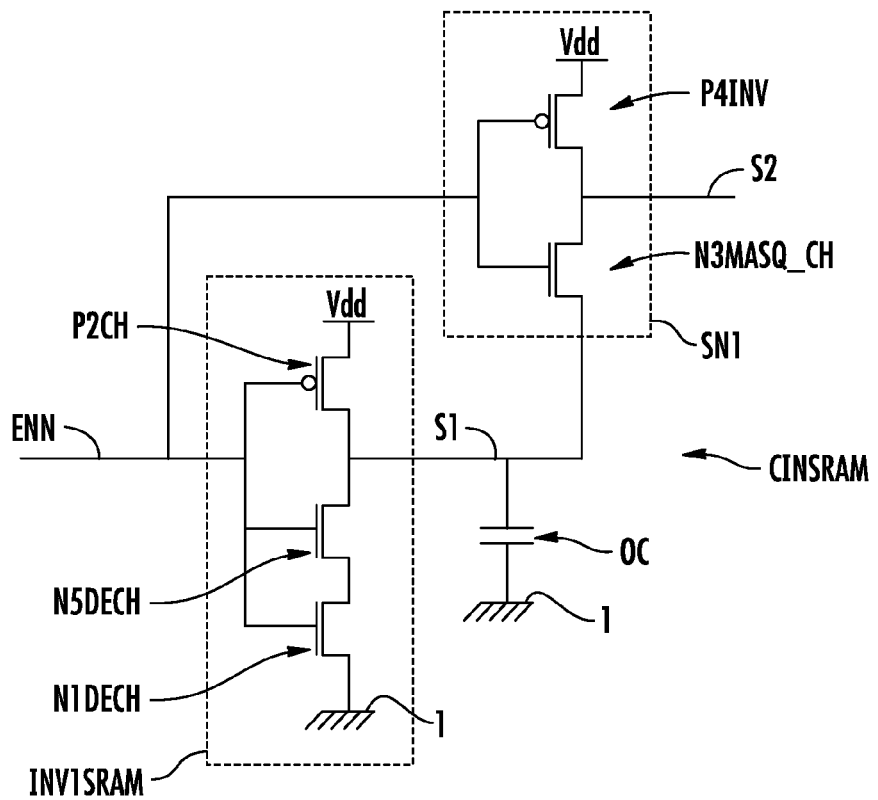
FIG. 2 schematically illustrates another embodiment of an integrated circuit equipped with a selector in accordance with the present invention.

In FIG. 2, an integrated circuit CINSRAM is shown that reproduces the environment of an SRAM type memory. The elements previously described in FIG. 1 have been reproduced in FIG. 2. The integrated circuit CINSRAM includes a first inverter INV1SRAM which includes the first and second transistors N1DECH, P2CH described in FIG. 1, and which also includes a fifth n-MOS transistor N5DECH configured such that its gate is connected to the input ENN of the first inverter INV1SRAM. Its source is connected to the output S1 of the first inverter INV1SRAM, and its drain is connected to the drain of the first transistor N1DECH of the first inverter INV1SRAM. Such an integrated circuit allows the performance parameters of the n-MOS transistors in an SRAM system to be measured.

Figure 3:
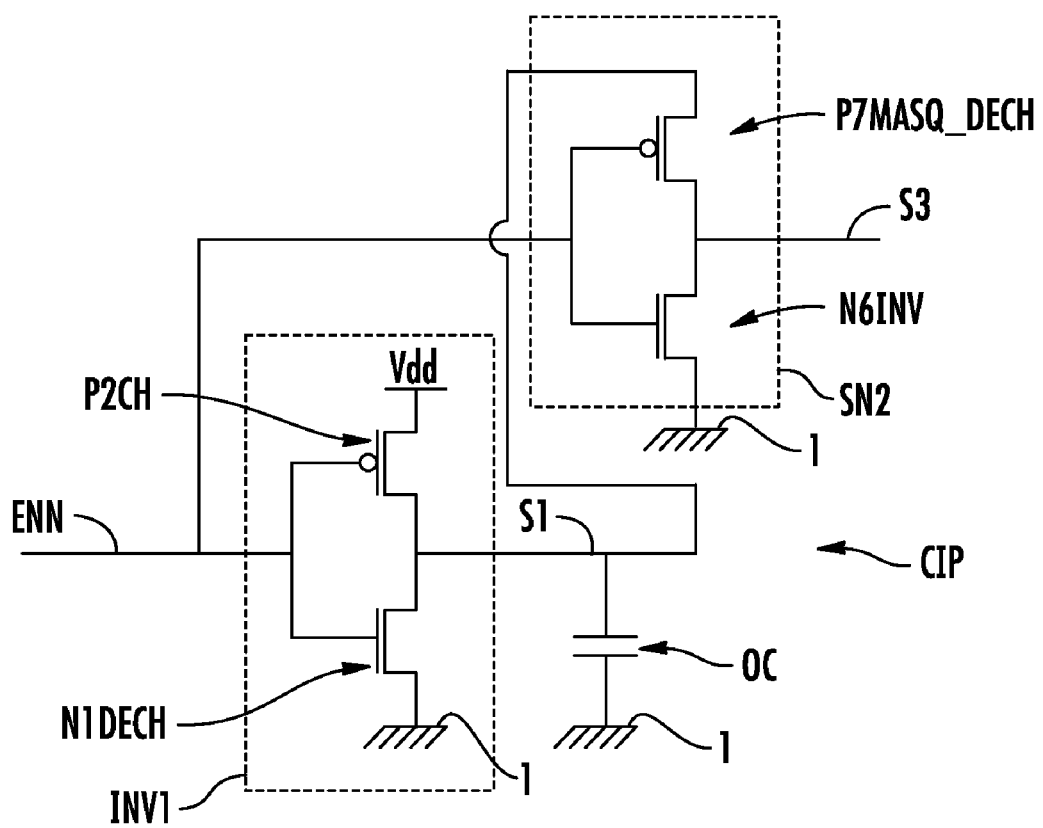
FIG. 3 illustrates yet another embodiment of an integrated circuit equipped with another selector in accordance with the present invention.

In FIG. 3, an integrated circuit CIP is shown that includes a selector SN2. Certain elements previously described in FIG. 1 have been reproduced here. The selector SN2 is a third inverter including a sixth transistor N6INV of the n-MOS conductivity type and a seventh transistor P7MASQ_DECH of the p-MOS conductivity type connected in parallel with the sixth transistor N6INV. The sixth and seventh transistors of the third inverter SN2 have their gate connected to the input ENN of the first inverter INV1 and their drain connected to an output S3 of the third inverter. The seventh transistor P7MASQ_DECH has its source connected to the output S1 of the first inverter INV1, and the sixth transistor N6INV has its source connected to ground 1.

The input ENN of the first inverter INV1 is capable of receiving an oscillating signal which is a control signal for the transistors of the integrated circuit CIP. The signal oscillates between 0 volts and the supply voltage Vdd.

When the input signal ENN is equal to 0 volts, the first and sixth n-MOS transistors N1DECH, N6INV are in the off state, and the second and seventh transistors P2CH, P7MASQ_DECH are on. In this case, the second transistor P2CH of the first inverter INV1 is on, which has the effect of charging the capacitive device OC, in other words, gradually increasing the potential of the capacitive device OC from zero to the supply voltage Vdd. Simultaneously, as the capacitive device OC is charged, the seventh transistor P7MASQ_DECH of the third inverter SN2 is on, which has the effect of transmitting the charge of the capacitive device OC, in other words, allowing the increase in the potential of the capacitive device OC to be seen on the signal produced at the output S3.

In the opposite case, when the input signal ENN is equal to the supply voltage Vdd, the first and sixth n-MOS transistors N1DECH, N6INV are on and the second and seventh transistors P2CH, P7MASQ_DECH are in the off state. In this case, the first transistor N1DECH of the first inverter INV1 is on, which has the effect of discharging the capacitive device OC, in other words, gradually decreasing the potential of the capacitive device OC from the supply voltage Vdd to 0 volts. Simultaneously, as the capacitive device OC is discharged, the seventh transistor P7MASQ_DECH of the third inverter SN2 is turned off, which has the effect of masking the discharge of the capacitive device OC, in other words, preventing the decrease in the potential of the capacitive device OC from being seen on the signal produced at the output S3. Furthermore, the sixth transistor N6INV of the third inverter SN2 is on, which has the effect of inverting the input signal ENN, in other words, rapidly bringing the signal produced at the output S3 to the zero voltage.

Figure 4:
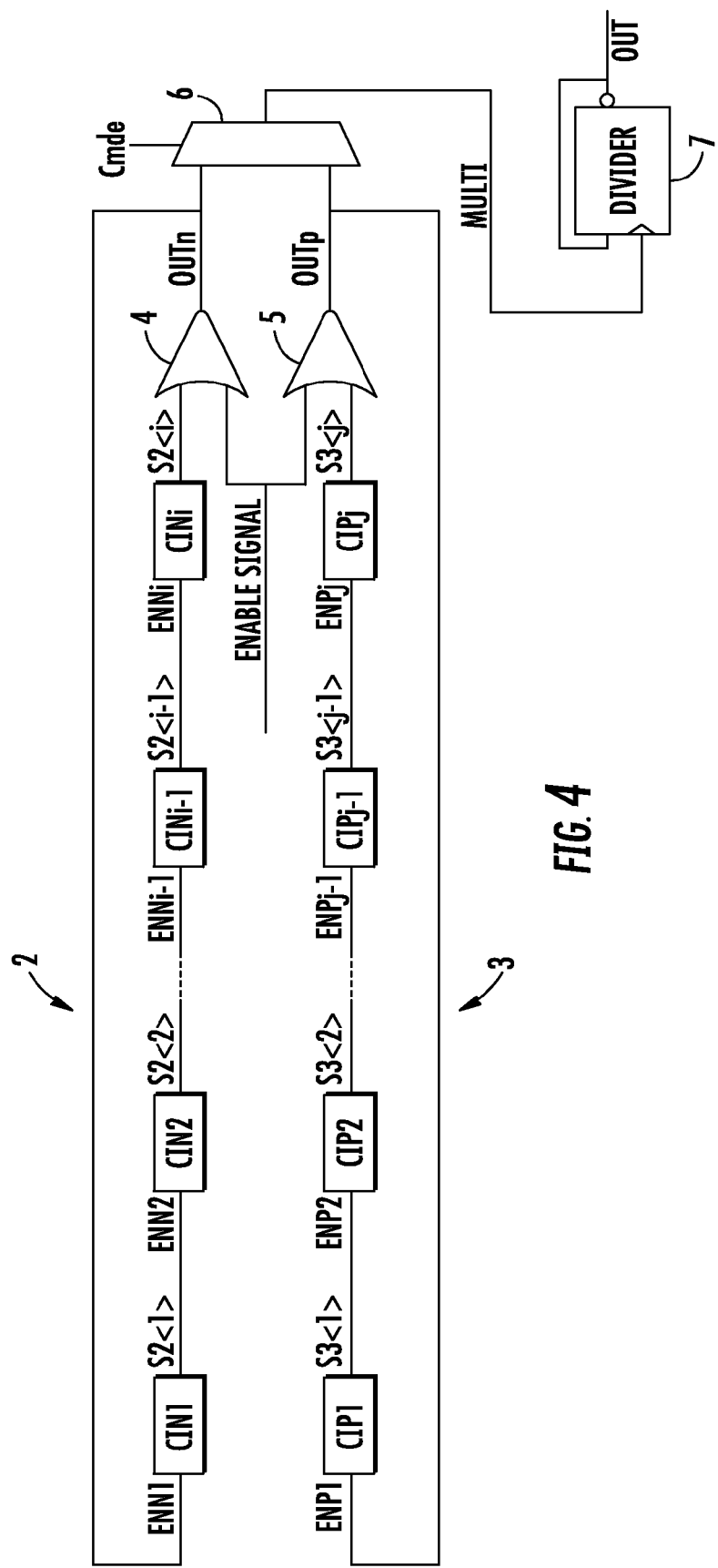
FIG. 4 schematically illustrates an example of a ring oscillator circuit equipped with several integrated circuits in accordance with the present invention.

In FIG. 4, an example of a ring oscillator circuit is shown equipped with several integrated circuits such as previously described in FIGS. 1 to 3. The ring circuit enables the performance parameters of several transistors of the two conductivity types to be measured. In addition, such a ring circuit provides for analyzing the frequency of an output signal from the ring oscillator. Indeed, the frequency of the ring oscillator output signal is the image of the propagation time of a signal in an integrated circuit. Therefore, by analyzing the frequency of the output signal of the ring oscillator, the speed performance parameters of an integrated circuit may be measured. Furthermore, the ring circuit allows a mean over a sample of transistors to be performed, where a sample could, for example, include a hundred or so integrated circuits.

The ring oscillator circuit may include only one or several integrated circuit loops. An integrated circuit loop includes an odd number of integrated circuits connected in series one after another, and where the output of the last circuit in the series is fed back onto the input of the first circuit. The number of integrated circuits generally must be odd so that the output of the last integrated circuit of the series is inverted with respect to the input of the first integrated circuit of the series, which leads to the generation of an oscillating signal within the integrated circuit loop.

A ring circuit including two integrated circuit loops 2, 3 is illustrated. The first integrated circuit loop 2 includes an odd number i of circuits of the CIN type which has previously been described in FIG. 1. The integrated circuits CIN1, CIN2, . . . , CINi are connected in series. The first integrated circuit CIN1 has an output S2<1>, which corresponds to the output S2 of the second inverter SN1. This output is connected to the input ENN2 of the neighboring integrated circuit CIN2. The input ENN2 corresponds to the input ENN of the first inverter INV1 of the neighboring integrated circuit CIN2. The output S2<i> of the last integrated circuit is then connected to a first input of a logic gate 4. The logic gate 4 includes an output OUTn, and also receives an enable signal EnableSignal on its second input. When the enable signal EnableSignal is enabled, the output OUTn of the logic gate 4 is equal to the output S2<i> of the last integrated circuit of the first loop 2. When the enable signal EnableSignal is disabled, the output OUTn of the logic gate 4 is zero. It should be noted that the output OUTn of the logic gate 4 is directly connected to the input ENN1 of the first circuit CIN1 of the first loop 2.

In one variant, the first integrated circuit loop 2 can include an odd number i of integrated circuits of the CINSRAM type, which has previously been described in FIG. 2. In this variant, the integrated circuits CINSRAM1, CINSRAM2, . . . , CINSRAMi are also connected in series in an analogous manner to the series of the integrated circuits of the CIN type previously described.

The second integrated circuit loop 3 includes an odd number j of circuits of the CIP type, which has previously been described in FIG. 3. The integrated circuits CIP1, CIP2, . . . , CIPj are connected in series. The first integrated circuit CIP1 has an output S3<1> which corresponds to the output S3 of the third inverter SN2. This output is connected to the input ENP2 of the neighboring integrated circuit CIP2. The input ENP2 corresponds to the input ENP of the first inverter INV1 of the neighboring integrated circuit CIP2. The output S3<j> of the last integrated circuit is then connected to a first input of a second logic gate 5. The second logic gate 5 includes an output OUTp and also receives the enable signal EnableSignal on its second input. When the enable signal EnableSignal is enabled, the output OUTp of the second logic gate 5 is equal to the output S3<j> of the last integrated circuit of the second loop 3. When the enable signal EnableSignal is disabled, the output OUTp of the second logic gate 5 is zero. It will be noted that the output OUTp of the second logic gate 5 is directly connected to the input ENP1 of the first circuit CIP1 of the second loop 3.

The ring oscillator circuit also includes a multiplexer 6 that receives the output signal OUTn from the first logic gate 4, the output signal OUTp from the second logic gate 5, and a Boolean control signal Cmde. The Boolean control signal Cmde allows a determination of which of the two signals, OUTn or OUTp, are to be analyzed.

The multiplexer 6 sends an output signal Multi to a divider 7. The output signal Multi is either equal to the output signal OUTn from the first logic gate 4, or equal to the output signal OUTp from the second logic gate 5, depending on the value of the Boolean control signal Cmde. The divider 7 divides the output signal Multi and produces a divider output signal OUT.

Figure 5:
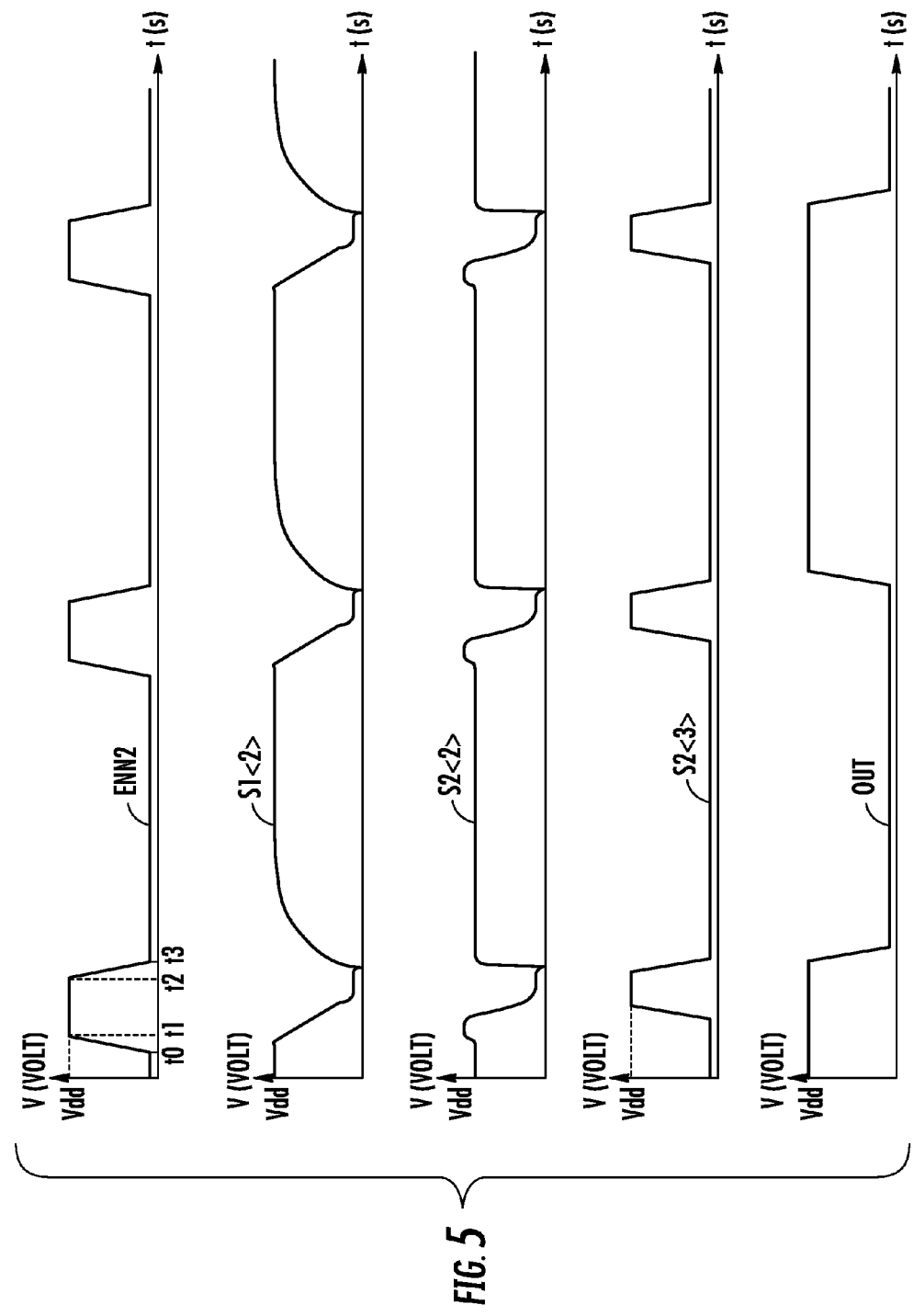
FIG. 5 illustrates voltage variations in the ring oscillator circuit described in FIG. 4.

In FIG. 5, voltage variations in the first loop 2 of the ring oscillator circuit, previously described in FIG. 4, are shown. The curve ENN2 illustrates the voltage variation over time at the input of the second integrated circuit CIN2. The curve S1<2> shows the voltage variation over time at the output of the first inverter INV1 of the second integrated circuit CIN2. The curve S2<2> shows the voltage variation over time at the output of the second inverter SN1 of the second integrated circuit CIN2. The curve S2<3> shows the voltage variation over time at the output of the second inverter SN1 of the third integrated circuit CIN3 (not shown in FIG. 4). The curve OUT shows the voltage variation over time at the output of the divider 7.

At time t0, the voltage of the input signal ENN2 is zero, and the voltages of the output signals S1<2> and S2<2> are equal to Vdd. At time t1, the voltage of the input signal ENN2 is inverted and becomes equal to Vdd. This has the effect of triggering the discharge of the capacitive device OC, in other words, of gradually decreasing the voltage of the output signal S1<2> from the value of the supply voltage Vdd down to the value 0 volts. Simultaneously, a gradual decrease is observed in the voltage of the output signal S2<2> from the value of the supply voltage Vdd down to the value 0 volts. At time t2, when the capacitive device is completely discharged, the voltages of the output signals S1<2> and S2<2> are equal to 0 volts.

It will be noted that the voltage of the output signal S1<2> is equal to 0 volts before t2. This is because the interval between the time when the voltage of the output signal S1<2> is equal to 0 volts and t2 corresponds to the propagation time of the signal within the loop 2 of the ring oscillator circuit and its return to the input ENN1 of the integrated circuit CIN1.

At time t3, the voltage of the input signal ENN2 is inverted once again, and becomes equal to 0 volts, having the effect of triggering the charging of the capacitive device OC, in other words, gradually increasing the voltage of the output signal S1<2> from the value 0 volts up to the value of the supply voltage Vdd. Simultaneously, a rapid increase is observed in the voltage of the output signal S2<2> from the value 0 volts to the value of the supply voltage Vdd. This rapid increase in the voltage of the output signal S2<2> has the effect of masking the gradual charging of the capacitive device OC. It will be noted that the curve ENN2 oscillates between 0 volts and the supply voltage Vdd.

Figure 6:
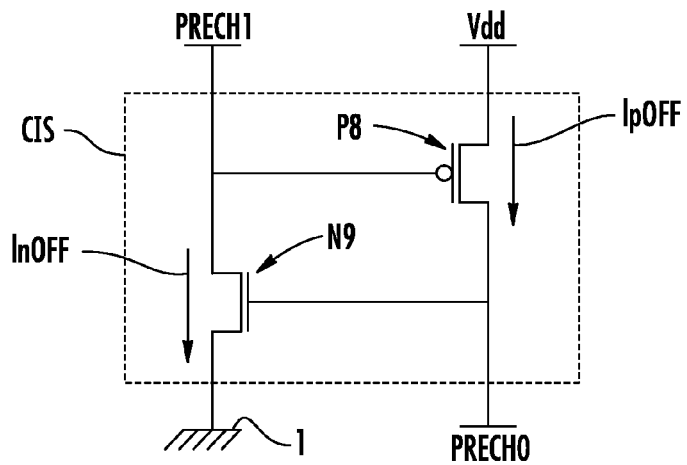
FIG. 6 schematically illustrates one embodiment of an additional integrated circuit in accordance with the present invention.

FIG. 6 schematically illustrates one embodiment of an additional integrated circuit. This additional integrated circuit allows the power consumption performance parameters of the transistors to be measured and may be added to an integrated circuit, such as described in the preceding FIGS. 1 to 4, in order to measure the overall speed and power consumption performance parameters of the transistors. In particular, the additional integrated circuit can operate independently of an integrated circuit when the study of the performance parameters only relates to the leakage currents of the transistors.

The additional integrated circuit CIS includes an eighth transistor P8 of the p-MOS conductivity type and a ninth transistor N9 of the n-MOS conductivity type. The eighth transistor P8 has its gate, which is capable of receiving a pre-charge signal PRECH1, reset to a high voltage, its source, which is connected to a supply voltage Vdd, and its drain, which is connected to a pre-charge signal PRECH0, reset to a low voltage. The ninth transistor N9 has its gate, connected to the drain of the eighth transistor P8, its source connected to ground 1, and its drain, connected to the gate of the eighth transistor P8.

In the initial state, the pre-charge signal is reset to a high voltage, for example, the supply voltage Vdd. The pre-charge signal PRECH0 is reset to a low voltage, for example, a zero voltage. In this initial state, the transistors P8 and N9 of the additional integrated circuit CIS are turned off.

Following this initial state, a leakage current IpOff flows between the source and the drain of the eighth transistor P8. This leakage current IpOff results in the supply voltage Vdd being discharged in the eighth transistor P8, and hence a gradual increase in the voltage of the signal PRECH0.

Simultaneously with the leakage current IpOff, a second leakage current InOff flows between the source and the drain of the ninth transistor N9. This leakage current InOff results in the signal PRECH1 being discharged in the ninth transistor N9, and hence a gradual decrease in the voltage of the signal PRECH1.

The gradual increase in the voltage of the signal PRECH0 has the tendency to gradually make the ninth transistor N9 conduct, which have the effect of accelerating the discharge of the signal PRECH1 in the ninth transistor N9 and, accordingly, accelerating the decrease in the voltage of the signal PRECH1. The gradual decrease in the voltage of the signal PRECH1 has the tendency to gradually make the eight transistor P8 conduct, which have the effect of accelerating the discharge of the supply voltage Vdd in the eighth transistor P8 and, accordingly, accelerating the increase in the voltage of the signal PRECH0. Moreover, after the complete discharge of the signal PRECH1 and the maximum increase in the voltage of the signal PRECHR0, the signal PRECH1 reaches a final value of zero, and the signal PRECH0 reaches the value of the supply voltage Vdd.

The acceleration of the discharging of the signal PRECH1 driving the acceleration of the increase in the voltage of the signal PRECH0, and vice versa, establishes an avalanche phenomenon, which has the effect of accelerating the discharge of the initial voltages of the input signals PRECH1 and PRECH0. It will be noted that, as this avalanche phenomenon occurs, the leakage currents IpOff and InOff increase rapidly. Furthermore, such an additional integrated circuit CIS inverts the pre-charge signals PRECH1 and PRECH0.

Figure 7:
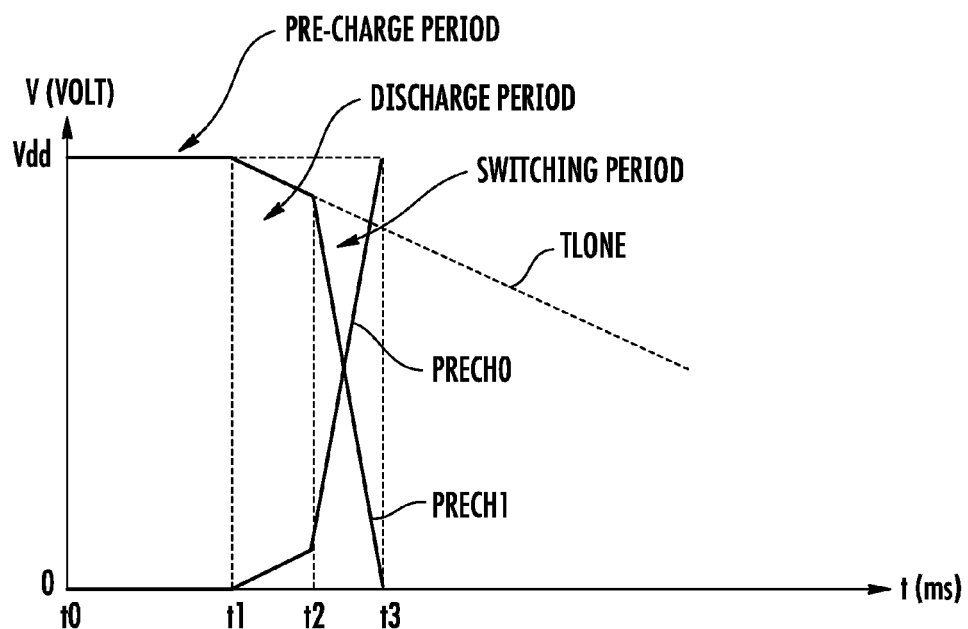
FIG. 7 illustrates voltage variations in the additional integrated circuit described in FIG. 6.

FIG. 7 illustrates voltage variations in the additional integrated circuit described in FIG. 6. In FIG. 7, the curve PRECH1 shows the pre-charge signal reset at time t0 to the supply voltage Vdd, and the curve PRECH0 of the pre-charge signal reset at time t0 to 0 volts. During the interval between time t0 and t1, the signals PRECH0 and PRECH1 are respectively reset to 0 volts and the supply voltage Vdd. This reset period is also denoted "pre-charge period." During the pre-charge period, the signals PRECH0 and PRECH1 are respectively held at 0 volts and at the supply voltage Vdd, which keeps the transistors P8 and N9 of the additional integrated circuit CIS in an off state.

After time t1, the pre-charge of the signals PRECH1 and PRECH0 is no longer maintained, and the system is left to drift. In other words, a leakage current IpOff flows between the terminals of the transistor P8, and a leakage current InOff flows between the terminals of the transistor N9. The transistors P8 and N9 then gradually start to conduct. This progressive phenomenon occurs over the period between times t1 and t2, denoted "discharge period." During the discharge period, the voltage of the signal PRECH1 gradually decreases from the value Vdd, and the voltage of the signal PRECH0 gradually increases from the zero value.

After the discharge period, in other words, over the period between times t2 and t3, there is an acceleration of the decrease in the voltage of the signal PRECH1, and an acceleration of the increase in the voltage of the signal PRECH0. The period between times t2 and t3 is also denoted "switching period," in other words, during this period, the pre-charge signals PRECH1 and PRECH0 are inverted. At time t3, end of switching, the voltage of the signal PRECH1 is zero and the voltage of the signal PRECH0 is equal to Vdd.

Also shown in FIG. 7 is the curve TLONE which illustrates the variation in the voltage between the source and the drain of a lone n-MOS transistor. The lone n-MOS transistor is held in the off state by a pre-charge signal for the pre-charge period. After this pre-charge period, the voltage of the lone transistor is left to drift and a leakage current appears leading to a gradual decrease in the pre-charge signal until the voltage of the pre-charge signal falls to zero. In contrast to the structure such as defined in FIG. 6, the decrease in the voltage of the pre-charge signal remains progressive after the pre-charge period. In the case of a lone transistor, there is no acceleration of the decrease in the voltage between the source and the drain of the lone n-MOS transistor. After time t2, the slope of the curve TLONE is shallower than the slope of the curve PRECH0.

It will be noted that the discharge period reflects the speed at which the leakage current is established across the terminals of the transistors of the two conductivity types. Indeed, the measurement of this period allows the performance of the transistors in terms of power consumption to be determined. The shorter this discharge period, the more the transistors allow leakage currents to be established, and the poorer the performance of the transistors.

Thus, in order to highlight the discharge period, it is important to reduce the pre-charge period and the switching period in order to obtain the shortest possible pre-charge period and switching period, and to reduce their influence on the discharge period. It is therefore important that the discharge period be much longer than the sum of the pre-charge period and the switching period. By virtue of the additional integrated circuit described in FIG. 6, the switching period is accelerated, which contributes to accelerating the measurement of the power consumption performance of the transistors.

Figure 8:
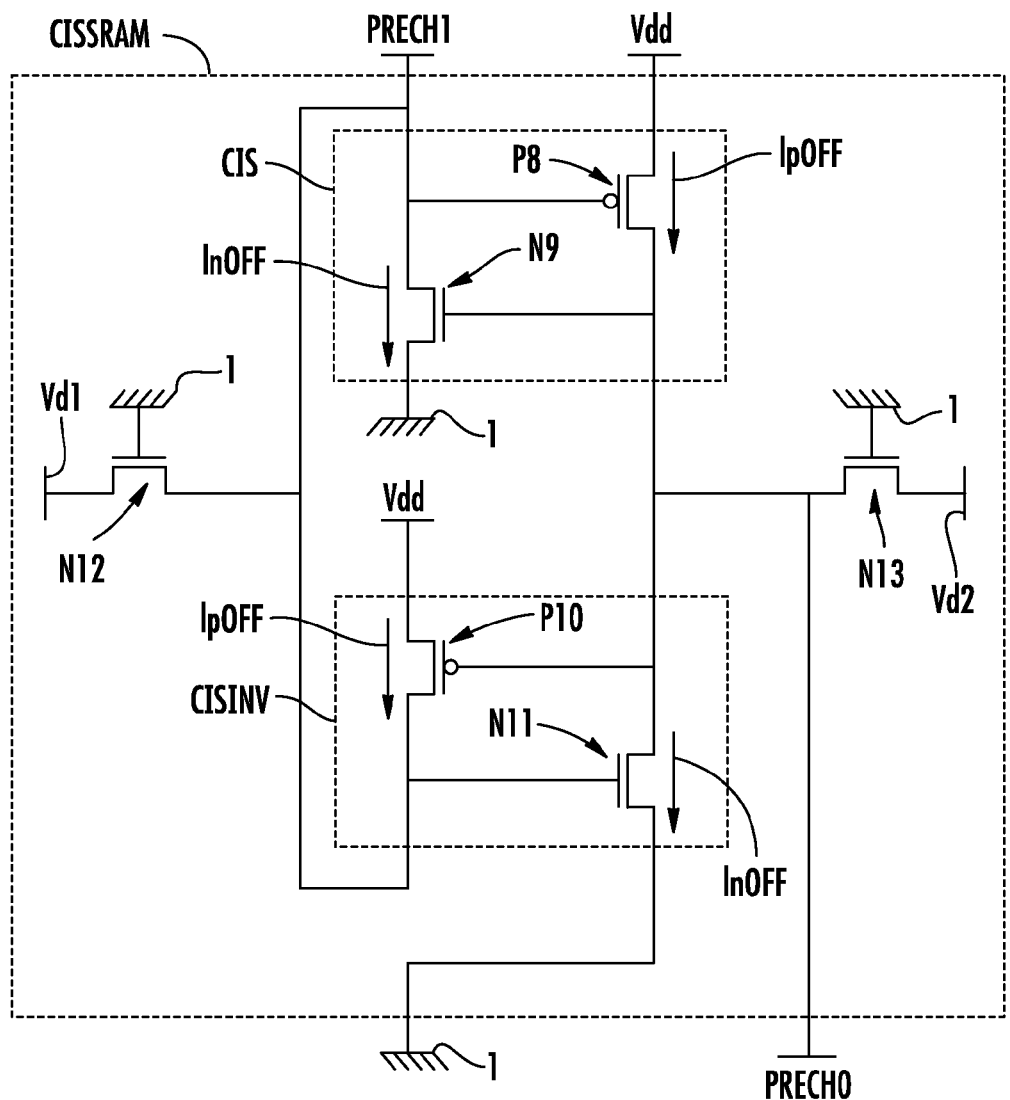
FIG. 8 schematically illustrates another embodiment of an additional integrated circuit in accordance with the present invention.

In FIG. 8, another embodiment of an additional integrated circuit is schematically shown. An additional integrated circuit CISSRAM is shown in FIG. 8 which includes the integrated circuit CIS described in FIG. 6 and a second additional integrated circuit CISINV. The second additional integrated circuit CISINV further includes a tenth transistor P10 of the p-MOS type having its gate connected to the pre-charge signal PRECH0 reset to a low voltage, and its drain being connected to the pre-charge signal PRECH1 reset to a high voltage.

The second additional integrated circuit CISINV also includes an eleventh transistor N11 of the n-MOS type having its gate connected to the pre-charge signal PRECH1 reset to a high voltage and its drain being connected to the pre-charge signal PRECH0 reset to a low voltage. In addition, the additional integrated circuit CISSRAM includes a twelfth transistor N12 of the n-MOS type having its gate connected to ground, its drain connected to the drain of the tenth p-MOS transistor P10, and its source being connected to a first input voltage Vd1. The additional integrated circuit CISSRAM also includes a thirteenth transistor N13 of the n-MOS type having its gate connected to ground 1, its drain connected to the drain of the eleventh n-MOS transistor N11, and its source connected to a second input voltage Vd2. The composition of the additional integrated circuit CISSRAM is similar to a structure of the SRAM type.

Figure 9:
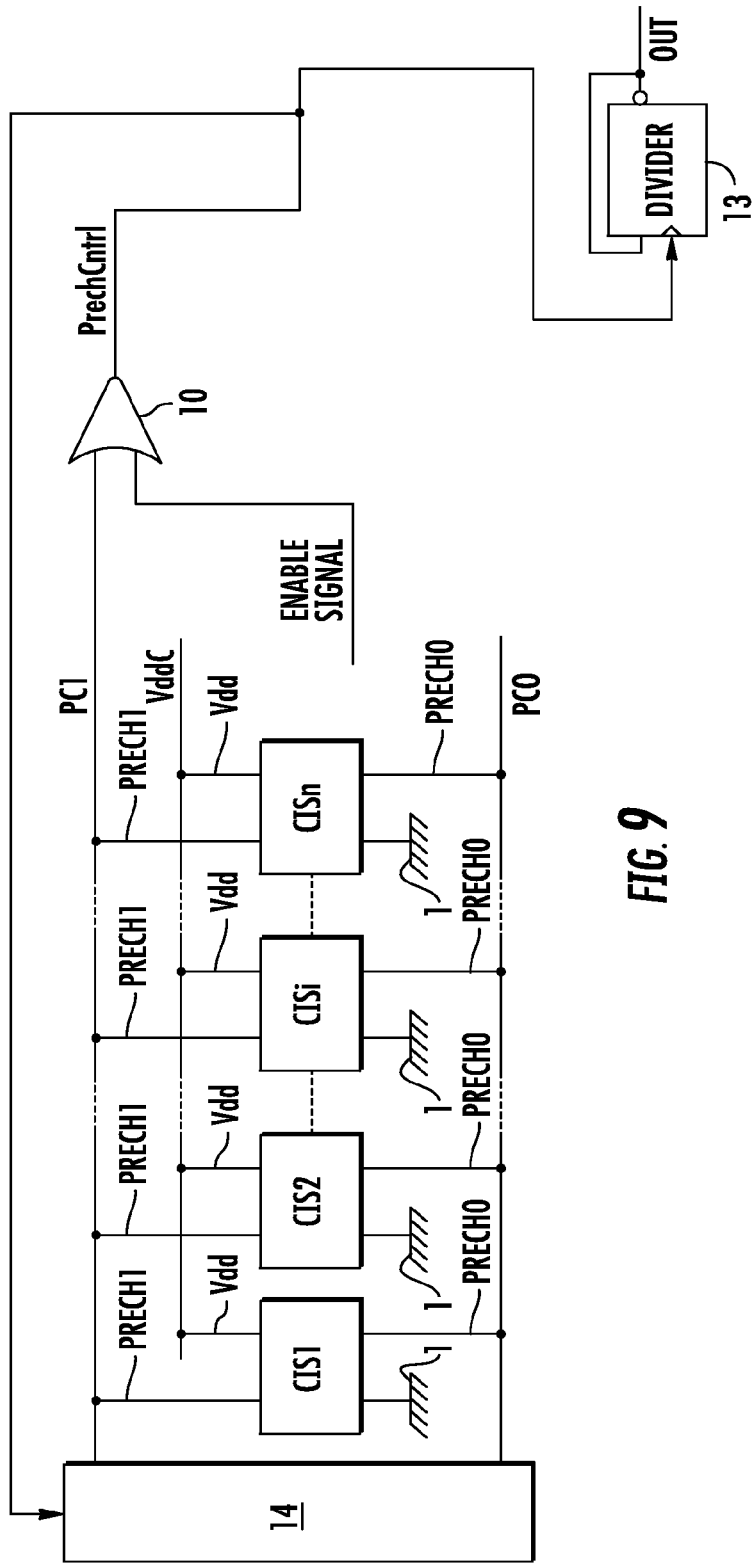
FIG. 9 schematically illustrates a circuit for measuring the performance parameters of at least one transistor equipped with several additional integrated circuits in accordance with the present invention.

FIG. 9 schematically illustrates one example of a circuit for measuring the performance parameters of at least one transistor equipped with several additional integrated circuits, such as previously described in FIGS. 6 to 8. The measurement circuit delivers an oscillating signal whose frequency is the image of the mean of the leakage currents of each additional integrated circuit. By analyzing the frequency of the output signal from the ring oscillator, the power consumption performance parameters of the transistors can therefore be measured in a simple fashion.

The measurement circuit includes several integrated circuits, and it allows the performance parameters of several transistors of the two types of conductivity to be measured. Furthermore, the measurement circuit allows a mean over a sample of transistors to be performed, where one sample could, for example, include a hundred or so additional integrated circuits.

By way of example, a measurement circuit including a number n of additional integrated circuits of the CIS type described in FIG. 6 is shown. The integrated circuits CIS1, CIS2, . . . , CISn are connected in parallel. Each additional integrated circuit CISi of the CIS type includes a transistor of a first conductivity type whose source is connected to a common ground 1, and whose drain is connected to a common pre-charge signal PC1 reset to a high voltage. Each additional integrated circuit CISi of the CIS type also includes a transistor of a second conductivity type whose source is connected to a common supply voltage VddC, and whose drain is connected to a common pre-charge signal PC0 reset to a low voltage.

The pre-charge signal PC1 reset to a high voltage is connected to a first input of a logic gate 10. This logic gate 10 also receives an enable signal EnableSignal on its second input and it produces a control signal PrechCntrl at its output. When the enable signal EnableSignal is enabled, the control signal PrechCntrl is equal to the pre-charge signal PC1 reset to a high voltage, and when the enable signal EnableSignal is disabled, the control signal PrechCntrl is zero. The measurement circuit furthermore includes a divider 13 and pre-charger 14 which each receive the control signal PrechCntrl produced from the output of the logic gate 10.

The divider 13 allows the control signal PrechCntrl to be divided and a divider output signal OUT is produced. The pre-charger 14 allows the pre-charge signals PC0 and PC1 to be reset according to the control signal PrechCntrl. When the control signal PrechCntrl is inverted, the pre-charger 14 resets the first signal PC1 to a high voltage, for example, to the supply voltage Vdd, and simultaneously resets the second signal PC0 to a low voltage, for example to the ground voltage 1.

The pre-charger 14 that provides a fast reset of the signals allows the pre-charge period to be accelerated, which contributes to accelerating the power consumption performance measurement of the transistors. In an analogous manner, the measurement circuit can include additional integrated circuits CISSRAM1, CISSRAM2, . . . , CISSRAMn of the CISSRAM type described in the preceding FIG. 8. As a variant, the pre-charge signal reset to a low voltage PC0 may be used to generate the control signal PrechCntrl.

Figure 10:
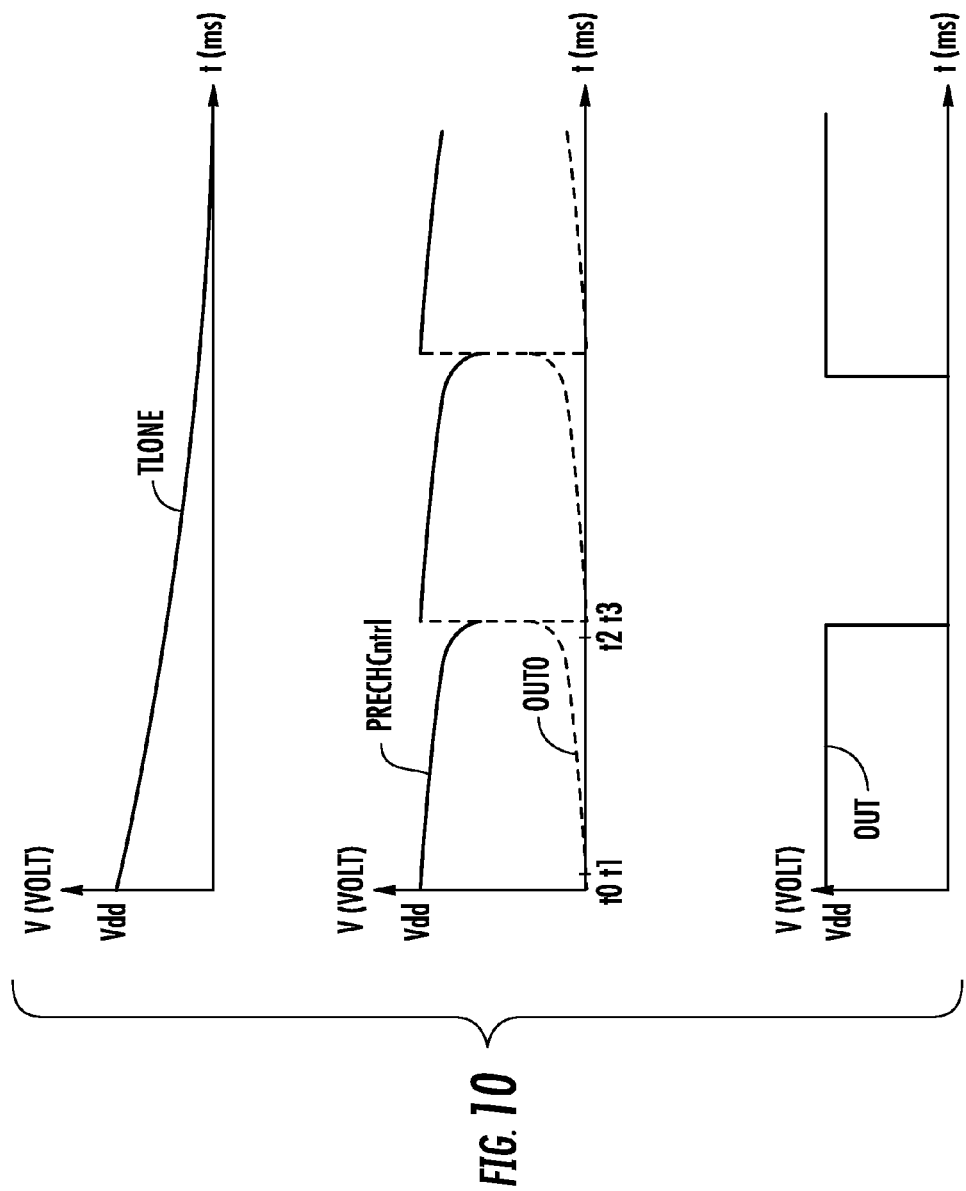
FIG. 10 illustrates voltage variations in the measurement circuit described in FIG. 9.

FIG. 10 shows voltage variations in the measurement circuit described in the preceding FIG. 9. The curve PrechCntrl illustrates the voltage variation over time of the first pre-charge signal PC1 reset to a high voltage. The curve OUT0 illustrates the voltage variation over time of the second pre-charge signal PC0 reset to a low voltage. The curve OUT shows the variation with time of the voltage at the output of the divider 13.

At time t0, the pre-charge signals PC0, PC1 are respectively reset to 0 volts and to the supply voltage Vdd. The pre-charge period between times t0 and t1 is very short. The period of time between t1 and t2 corresponds to the discharge period during which the curve PrechCntrl is substantially equal to the supply voltage Vdd, and the curve OUT is equal to the supply voltage Vdd. The interval between times t2 and t3 corresponds to the switching period. At time t3, the signal PrechCntrl is inverted, which triggers the resetting of the pre-charge signals for the next cycle.

The variation with time of the voltage of the signal TLONE is also shown for a lone n-MOS transistor. The discharge in the lone n-MOS transistor in general decreases very slowly. In particular, the discharge decreases rapidly between times t0 and t2, then it decreases very slowly. It will be noted that the curve OUT oscillates between 0 volts and the supply voltage Vdd.

A method can be implemented by the circuits which have just been described in the preceding FIGS. 1 to 9. The embodiments and their implementation that have just been described notably exhibit the following advantages determining the performance parameters for the components of an electronic integrated circuit, facilitating the design of integrated circuits.

That which is claimed:

1. An integrated circuit comprising:
   a first inverter comprising
      a first transistor of a first conductivity type,
      a second transistor of a second conductivity type coupled in parallel with the first transistor,
      an input configured to receive an oscillating input signal, and
      an output configured to deliver an oscillating output signal,
      said first and second transistors each comprising a control terminal coupled to said input of said first inverter and a conduction terminal coupled to the output of said first inverter,
      said first transistor comprising a second conduction terminal to be coupled to a reference voltage, and
      said second transistor comprising a second conduction terminal to be coupled to a supply voltage;
   a capacitive device coupled to said output of said first inverter and capable of being charged and discharged depending on the state of the first and second transistors being on or off; and
   a selector configured to transmit the oscillating output signal and configured to mask at least one of the charging and discharging of said capacitive device, said selector comprising
   a second inverter comprising
      a third transistor of the first conductivity type,
      a fourth transistor of the second conductivity type coupled in parallel with said third transistor, and
      an output,
      said third and fourth transistors each comprising a control terminal coupled to said input of said first inverter and a conduction terminal coupled to the output of said second inverter,
      said fourth transistor comprising a second conduction terminal to be coupled to the supply voltage,
      said third transistor comprising a second conduction terminal coupled to the output of said first inverter.

2. The integrated circuit according to claim 1 wherein each of said first and second transistors comprises a metal oxide semiconductor field effect transistor (MOSFET).

3. The integrated circuit according to claim 1 wherein said first inverter further comprises:
   a fifth transistor of the first conductivity type and comprising
      a control terminal coupled to the input of said first inverter,
      a conduction terminal coupled to the output of said first inverter, and
      a second conduction terminal coupled to the first conduction terminal of said first transistor of said first inverter.

4. An integrated circuit comprising:
   a first inverter comprising
      a first transistor of a first conductivity type,
      a second transistor of a second conductivity type coupled in parallel with the first transistor,
      an input configured to receive an oscillating input signal, and
      an output configured to deliver an oscillating output signal,
   a capacitive device coupled to said output of said first inverter and capable of being charged and discharged depending on the state of the first and second transistors being on or off; and
   a selector configured to transmit the oscillating output signal and configured to mask at least one of the charging and discharging of said capacitive device,
   wherein said selector comprises:
   a third inverter comprising
      a sixth transistor of the first conductivity type,
      a seventh transistor of the second conductivity type coupled in parallel with the sixth transistor, and
      an output,
      said sixth and seventh transistors each comprising a control terminal coupled to the input of said first inverter and a first conduction terminal coupled to the output of the third inverter,
      said seventh transistor comprising a second conduction terminal coupled to the output of the first inverter,
      said sixth transistor further comprising a second conduction terminal to be coupled to a reference voltage.

5. A ring oscillator circuit comprising:
   an odd number of integrated circuits each comprising
      a first inverter comprising
         a first transistor of a first conductivity type,
         a second transistor of a second conductivity type coupled in parallel with the first transistor,
         an input configured to receive an oscillating input signal, and
         an output configured to deliver an oscillating output signal,
      a capacitive device coupled to said output and capable of being charged and discharged depending on the state of the first and second transistors being on or off, and a selector configured to transmit the oscillating output signal and configured to mask at least one of the charging and discharging of said capacitive device;

said odd number of integrated circuits being mounted in series so that the input of said first inverter of one of said odd number of integrated circuits is coupled to an output of said selector of a neighboring one of said odd number of integrated circuits in the series.

6. A measuring circuit configured to measure performance parameters of at least one transistor of an integrated circuit comprising a first inverter comprising a first transistor of a first conductivity type, a second transistor of a second conductivity type coupled in parallel with the first transistor, an input configured to receive an oscillating input signal, and an output configured to deliver an oscillating output signal, the circuit further comprising a capacitive device coupled to the output and capable of being charged and discharged depending on the state of the first and second transistors being on or off, and a selector configured to transmit the oscillating output signal and configured to mask at least one of the charging and discharging of the capacitive device, the measuring circuit comprising:

an additional integrated circuit comprising an eighth transistor of the second conductivity type comprising a control terminal configured to receive a pre-charge signal reset to a high voltage, a first conduction terminal to be coupled to a supply voltage, and a second conduction terminal coupled to a pre-charge signal reset to a low voltage, and a ninth transistor of the first conductivity type comprising a control terminal coupled to said second conduction terminal of said eighth transistor, a first conduction terminal to be coupled to a reference voltage, and a second conduction terminal coupled to the control terminal of said eighth transistor.

7. The measuring circuit according to claim 6 further comprising:

a second additional integrated circuit comprising a tenth transistor of the second conductivity type comprising a control terminal coupled to the pre-charge signal reset to a low voltage, and a first conduction terminal coupled to the pre-charge signal reset to a high voltage, an eleventh transistor of the first conductivity type comprising a control terminal coupled to the pre-charge signal reset to a high voltage and a first conduction terminal coupled to the pre-charge signal reset to a low voltage, a twelfth transistor of the first conductivity type comprising a control terminal to be coupled to the reference voltage, a first conduction terminal coupled to said first conduction terminal of the tenth transistor, and a second conduction terminal coupled to a first input voltage, and a thirteenth transistor of the first conductivity type comprising a control terminal to be coupled to the reference voltage, a first conduction terminal coupled to the first conduction terminal of said eleventh transistor, and a second conduction terminal coupled to a second input voltage.

8. The measuring circuit according to claim 6 further comprising:

a plurality of further additional integrated circuits coupled in parallel so that the pre-charge signal reset to a high voltage of each additional and each of said plurality of further additional integrated circuits are coupled to a first common pre-charge signal reset to a high voltage, and wherein the supply voltage for each additional and each of said plurality of further additional integrated circuits are coupled to a common supply voltage, the pre-charge signals reset to a low voltage of each additional integrated circuit are coupled to a second common pre-charge signal reset to a low voltage; and a pre-charger configured to detect an inversion of at least one common pre-charge signal and configured to reset the common pre-charge signals at each inversion of at least one common pre-charge signal.

9. A telephone system comprising:

an inverter comprising a first transistor of a first conductivity type, a second transistor of a second conductivity type coupled in parallel with the first transistor, an input configured to receive an oscillating input signal, and an output configured to deliver an oscillating output signal, said first and second transistors each comprising a control terminal coupled to said input of said first inverter and a conduction terminal coupled to the output of said first inverter, said first transistor comprising a second conduction terminal to be coupled to a reference voltage, and said second transistor comprising a second conduction terminal to be coupled to a supply voltage, a capacitive device coupled to said output of said first inverter and capable of being charged and discharged depending on the state of the first and second transistors being on or off, and a selector configured to transmit the oscillating output signal and configured to mask at least one of the charging and discharging of said capacitive device, said selector comprising a second inverter comprising a third transistor of the first conductivity type, a fourth transistor of the second conductivity type coupled in parallel with said third transistor, and an output, said third and fourth transistors each comprising a control terminal coupled to said input of said first inverter and a conduction terminal coupled to the output of said second inverter, said fourth transistor comprising a second conduction terminal to be coupled to the supply voltage, said third transistor comprising a second conduction terminal coupled to the output of said first inverter.

10. A method configured to measure the performance parameters of at least one transistor of an inverter having a first transistor of a first conductivity type and a second transistor of a second conductivity type, an input of the inverter being configured to receive an oscillating input signal, the method comprising:

charging and discharging a capacitive device depending on a state of the first and second transistors being on or off;

delivering an oscillating output signal at an output of the inverter;

masking at least one of the charging and discharging of the capacitive device;

pre-charging to opposite initial voltages, a third transistor of the first conductivity type and fourth transistor of the second conductivity type to turn off the third and fourth transistors; and resetting the pre-charging when at least one of the voltages is inverted with respect to its initial value.

* * * * *

UNITED STATES PATENT AND TRADEMARK OFFICE
CERTIFICATE OF CORRECTION

PATENT NO. : 8,044,728 B2  
APPLICATION NO. : 12/543162  
DATED : October 25, 2011  
INVENTOR(S) : Barasinski et al.

Page 1 of 1

It is certified that error appears in the above-identified patent and that said Letters Patent is hereby corrected as shown below:

| | |
|---|---|
| Column 10, Line 12 | Delete: "signal is" <br> Insert: --signal PRECH1 is-- |
| Column 10, Line 30 | Delete: "have" <br> Insert: --has-- |
| Column 10, Line 34 | Delete: "eight" <br> Insert: --eighth-- |
| Column 10, Line 35 | Delete: "have" <br> Insert: --has-- |
| Column 10, Line 40 | Delete: "PRECHR0" <br> Insert: --PRECH0-- |

Signed and Sealed this  
Sixth Day of March, 2012

David J. Kappos  
*Director of the United States Patent and Trademark Office*